US009409784B2

(12) United States Patent
Czettl (10) Patent No.: US 9,409,784 B2
(45) Date of Patent: Aug. 9, 2016

(54) METHOD FOR PRODUCING A HARD MATERIAL LAYER ON A SUBSTRATE, HARD MATERIAL LAYER AND CUTTING TOOL (71) Applicant: CERATIZIT AUSTRIA GESELLSCHAFT MBH, Reutte (AT)

(72) Inventor: Christoph Czettl, Poels (AT)

(73) Assignee: Ceratizit Austria GmbH, Reutte (AT)

(*) Notice: Subject to any disclaimer, the term of this patent is extended or adjusted under 35 U.S.C. 154(b) by 0 days.

(21) Appl. No.: 14/381,275

(22) PCT Filed: Feb. 25, 2013

(86) PCT No.: PCT/AT2013/000034
§ 371 (c)(1),
(2) Date: Aug. 27, 2014

(87) PCT Pub. No.: WO2013/126935
PCT Pub. Date: Sep. 6, 2013

(65) Prior Publication Data
US 2015/0099108 A1 Apr. 9, 2015

(30) Foreign Application Priority Data
Feb. 27, 2012 (AT) .................................. GM74/2012

(51) Int. Cl.
*C23C 16/30* (2006.01)
*C01B 35/08* (2006.01)
(Continued)

(52) U.S. Cl.
CPC ............ C01B 35/08 (2013.01); B22D 11/1206 (2013.01); B22D 11/1287 (2013.01);
(Continued)

(58) Field of Classification Search
USPC ............ 51/307, 309; 428/697, 698, 699, 701, 428/702, 704; 427/255, 255.28, 255.36, 427/255.391
See application file for complete search history.

(56) References Cited

U.S. PATENT DOCUMENTS 4,746,563 A * 5/1988 Nakano ................. C23C 30/005
427/255.34
4,895,770 A 1/1990 Schintlmeister et al.
(Continued)

FOREIGN PATENT DOCUMENTS

AT          008346 U1       6/2006
DE          4343354 A1      6/1995
(Continued)

OTHER PUBLICATIONS

Holzschuh H: "Chemical-vapor deposition of wear resistant hard coatings in the Ti—B—C—N system: properties and metal-cutting tests", International Journal of Refractory Metals and Hard Materials, Elsevier Publishers, Barking, GB, vol. 20, No. 2, Mar. 1, 2002, pp. 143-149, XP004382026, ISSN: 0263-4368, DOI: 10.1016/S0263-4368(02)00013-6.
(Continued)

Primary Examiner — Archene Turner
(74) Attorney, Agent, or Firm — Laurence A. Greenberg; Werner H. Stemer; Ralph E. Locher (57) ABSTRACT A process for producing a hard material layer on a substrate includes depositing a TiCNB hard material layer by chemical vapor deposition (CVD) from a gas system including a titanium source, a boron source, at least one nitrogen source and at least one carbon source, in which the carbon source includes an alkane having at least two carbon atoms, an alkene or an alkyne. A cutting tool includes a substrate to which a TiCNB hard material layer has been applied, in which a ratio of carbon atoms (C) to nitrogen atoms (N) in the TiCxNyB1-x-y system deposited on the substrate is $0.70 \leq X \leq 1.0$, preferably $0.75 \leq X \leq 0.85$, and a polished section through the substrate and the hard material layer is substantially free of an eta phase following Murakami etching.

23 Claims, 3 Drawing Sheets (51) Int. Cl.
*B22D 11/12* (2006.01)
*B22D 11/128* (2006.01)
*C23C 16/44* (2006.01)
*C23C 16/56* (2006.01)
*C23C 30/00* (2006.01)
*C23C 28/04* (2006.01)
*B23B 27/14* (2006.01)
*C23C 16/32* (2006.01)
*C23C 16/34* (2006.01)
*C23C 16/38* (2006.01)
*C23C 16/40* (2006.01)
*C23C 16/52* (2006.01)

(52) U.S. Cl.
CPC ............ *B23B27/14* (2013.01); *C23C 16/30* (2013.01); *C23C 16/32* (2013.01); *C23C 16/34* (2013.01); *C23C 16/38* (2013.01); *C23C 16/403* (2013.01); *C23C 16/44* (2013.01); *C23C 16/52* (2013.01); *C23C 16/56* (2013.01); *C23C 28/042* (2013.01); *C23C 28/044* (2013.01); *C23C 30/005* (2013.01); *B23B 2222/28* (2013.01); *B23B 2228/04* (2013.01); *B23B 2228/105* (2013.01); *Y10T 428/265* (2015.01)

(56) References Cited

U.S. PATENT DOCUMENTS

| | | | |
|---|---|---|---|
| 6,146,697 A | 11/2000 | Undercoffer | |
| 6,492,011 B1* | 12/2002 | Brandle | C23C 14/024 407/119 |
| 6,627,335 B2* | 9/2003 | Kodama | C23C 16/32 407/119 |
| 7,087,295 B2 | 8/2006 | Okada et al. | |
| 7,521,132 B2 | 4/2009 | Kathrein et al. | |
| 7,867,633 B2* | 1/2011 | Moore | C03B 11/086 51/307 |
| 8,080,324 B2* | 12/2011 | Yamamoto | C23C 14/0021 428/698 |
| 8,293,359 B2 | 10/2012 | Kathrein | |
| 2004/0259353 A1 | 12/2004 | Engbrecht et al. | |
| 2014/0017469 A1 | 1/2014 | Fukunaga et al. | |

FOREIGN PATENT DOCUMENTS

| | | | |
|---|---|---|---|
| EP | 0306077 | A2 | 3/1989 |
| EP | 1473101 | A1 | 11/2004 |
| JP | H05171336 | A | 7/1993 |
| JP | 2001-269801 | * | 10/2001 |
| KR | 20030052468 | * | 6/2003 |
| KR | 20030062049 | * | 7/2003 |
| WO | 9516799 | A1 | 6/1995 |
| WO | 0052224 | A1 | 9/2000 |
| WO | 2008119095 | A1 | 10/2008 |
| WO | 2012133461 | A1 | 10/2012 |

OTHER PUBLICATIONS

Holzschuh H: "Moderate temperature CVD of Ti—B—C—N on cemented carbide tools: properties and metal-cutting tests", Journal De Physique IV, Editions De Physique. Les Ulis Cedex, FR, vol. 10, No. 2, Sep. 10, 1999, pp. pr2-pr49, XP008094538, ISSN: 1155-4339.
Holzschuh H: "Chemical-Vapor Deposition of Wear Resistant Hard Coatings in the Ti—B—C—N System: Properties and Metal-Cutting Tests,", 15th Internatinal Plansee Seminar, Publisher: G. Kneringer, P.Roedhammer and H. Wildner, Plansee Holding AG, Reutte (2001), vol. 2, pp. 441-451.
Holzschuh H: "Moderate Temperature CVD Coatings in the Ti—B—C—N System", Publisher G. Kneringer, P. Roedhammer and H. Wildner, HM 59, Plansee Seminar, Plansee Holding AG, Reutte, 2005, pp. 801-811.
Czettl C et al.: "C2H6 as precursor for low pressure chemical vapor deposition of TiCNB hard coatings", Elsevier, Surface & Coatings Technology 215 (2013) 127-132.
Larsson A et al.: "Microstructure and properties of Ti(C,N0 coatings produced by moderate temperature chemical vapour depostion", Elsevier, Thin Solid Films 402 (2002) 203-210.

* cited by examiner

METHOD FOR PRODUCING A HARD MATERIAL LAYER ON A SUBSTRATE, HARD MATERIAL LAYER AND CUTTING TOOL

BACKGROUND OF THE INVENTION

Field of the Invention

The present invention relates to a process for producing a hard material layer on a substrate, wherein a TiCNB hard material layer is deposited on the substrate. The process is preferably used for producing cutting tools for turning, milling or other cutting processes.

The present invention further relates to a hard material layer and a cutting tool, preferably a cutting body or an indexable insert.

It is known to apply TiCNB hard material coatings onto cutting tools and other components subject to wear to improve wear resistance. Corresponding cutting tools are used in the form of cutting bodies or indexable inserts in turning and milling apparatuses for example.

The particular hard material coating is typically deposited on likewise wear resistant substrate materials by means of physical or chemical deposition of layers from the vapor phase or the gas phase. Examples of substrate materials used here include cemented carbides, cermets, hard material and tool steels.

Cemented carbide is understood to mean a composite material typically comprising a main phase of tungsten carbide (WC) and optionally phases of further carbides and a metallic binder or an appropriate metallic matrix. The metallic matrix is typically cobalt, nickel and/or iron. Further carbides that can be used are carbides of metals of the fourth (titanium group), fifth (vanadium group) and sixth (chromium group) transition groups, i.e., for example, of tantalum, niobium, hafnium, zirconium etc.

Cermets are understood to mean composite materials which, in terms of the carbide, comprise titanium carbide as the main phase. Nickel and/or cobalt typically form the main component of the binder.

Hard materials are understood to mean materials having a hardness of more than 10 GPa.

In turn, tool steels, according to DIN 17300, are steels defined by their use in tools.

In the coating processes, the coating of the respective substrates to produce the cutting tools can be effected by chemical or by physical means. Relevant coating processes are the CVD process (chemical vapor deposition) and the PVD process (physical vapor deposition).

In the CVD process, which will be mainly considered herein below, there are essentially three different types of process procedure. The HT-CVD process also known as the high temperature CVD process is carried out at temperatures of from about 900° C. to 1100° C. The MT-CVD process also known as the medium temperature CVD process is carried out at temperatures of from about 700° C. to 900° C. Furthermore, a PA-CVD process or plasma-activated CVD process which is carried out at temperatures of from 450° C. to 650° C. is known but is not considered further herein below.

In the CVD process, chemical reactions are initiated under low vacuum conditions ($10^3$ to $10^5$ Pa) with supply of heat or radiative energy and said reactions yield, in addition to the volatile products, the now industrially utilizable hard material layer on the respective substrate.

In terms of the TiCNB hard material coatings, it is known to deposit these on a substrate from a gas system consisting of $TiCl_4$, $CH_4$, $N_2$, $H_2$ and $BCl_3$ in a HT-CVD process and temperatures of from 950° C. to 1050° C. are used here. This process is described in H. Holzschuh, in: G. Kneringer, P. Rödhammer, H. Wildner (publisher), *Plansee Seminar, Plansee Holding AG*, Reutte, 2001, Vol. 2, pages 441ff. for example.

The publication mentioned also discloses an MT-CVD process which is used to deposit a TiCNB hard material layer on a substrate at temperatures of from 700° C. to 900° C. The gas system differs from the HT-CVD process in that now acetonitrile ($CH_3CN$), i.e. a nitrile, is used as organic precursor instead of the methane ($CH_4$) used in the HT-CVD process. Using acetonitrile, which is distinctly more reactive than methane, makes it possible to achieve deposition of the TiCNB hard material layer in this way even at the lower temperatures used in the MT-CVD process.

However, in the mentioned MT-CVD process for depositing a TiCNB hard material coating on a substrate using acetonitrile, the atomic ratio of carbon C to nitrogen N in the $TiC_xN_yB_{1-x-y}$ system is restricted to $0.50 \leq X \leq 0.67$. Using acetonitrile as organic precursor does indeed make it possible to deposit the TiCNB at the lower temperatures in the MT-CVD of from 700° C. to 900° C. on account of the greater reactivity of acetonitrile, but the atomic ratio of carbon to nitrogen in the $TiC_xN_{1-x}$ system cannot be increased beyond X=0.67 (see also A. Larsson, S. Ruppi, *Thin Solid Films* 402/1-2 (2002), pages 203ff.). This limitation of the possible compositions of the TiCNB hard material layer in the MT-CVD process arises from the acetonitrile-limited supply ratio of carbon to nitrogen.

In the MT-CVD process, decarburization of the substrate interface during the deposition in the CVD reactor can be reduced on account of the lower temperatures compared to the HT-CVD process and accordingly the formation of a brittle eta phase (η phase) in the region of the substrate interface can be abated or avoided in this way. Abating or avoiding the formation of the eta phase makes it possible to improve the adhesion properties of the TiCNB hard material layer on the substrate and hence the properties of the cutting tool produced in this way can be improved.

It is further known that doping a TiCN system with boron can further increase the hardness of the deposited hard material layer (see also H. Holzschuh, in: G. Kneringer, P. Rödhammer, H. Wildner (publisher), *Plansee Seminar, Plansee Holding AG*, Reutte, 2001, Vol. 2, pages 441ff.). However, it is also known that at coating temperatures in excess of 900° C., a brittle cobalt-tungsten-boron phase arises through boron diffusion at the relevant interface which can have a negative impact on the cutting properties of the hard material layer thus produced (see also H. Holzschuh, in: G. Kneringer, P. Rödhammer, H. Wildner (publisher), *Plansee Seminar, Plansee Holding AG*, Reutte, 2005, pages 801ff).

BRIEF SUMMARY OF THE INVENTION

It is an object of the present invention to specify, starting from the known prior art, a process for producing a hard material layer on a substrate and also a hard material layer and a cutting tool having further improved properties with regard to wear resistance.

This object is achieved by a process for producing a hard material layer on a substrate, wherein a TiCNB hard material layer is deposited by chemical vapor deposition (CVD) from a gas system including a titanium source, a boron source, at least one nitrogen source and at least one carbon source, in which the carbon source includes an alkane having at least two carbon atoms, an alkene or an alkyne. Advantageous developments are evident from the dependent claims.

Accordingly, in the process for producing a hard material layer on a substrate, a TiCNB hard material layer is deposited by chemical vapor deposition (CVD) from a gas system comprising a titanium source, a boron source, at least one nitrogen source and at least one carbon source. According to the invention, the carbon source comprises an alkane having at least two carbon atoms, an alkene or an alkyne.

The carbon source is preferably an alkane having at least two carbon atoms, an alkene or an alkyne.

An alkane having at least two carbon atoms is understood to mean the alkanes from ethane ($C_2H_6$) onward corresponding to a general empirical formula $C_nH_{2n+2}$ where n=2, 3, 4, . . . .

Alkenes are described by the general empirical formula $C_nH_{2n}$ where n=2, 3, 4, . . . .

Alkynes are described by the general empirical formula $C_nH_{2n-2}$ where n=2, 3, 4, . . . .

Using an alkane having at least two carbon atoms, an alkene or an alkyne makes it possible to deposit a TiCNB hard material layer on the substrate with the CVD process, wherein the carbon to nitrogen ratio can be adjusted freely. Compared to the methane typically used, the alkanes, alkenes and alkynes mentioned are more reactive and the deposition of the TiCNB layer can therefore take place even at relatively low temperatures and, in particular, also in the MT-CVD process.

Furthermore, even at relatively low reaction temperatures the restriction of the carbon to nitrogen ratio, which ratio was predetermined by the conventional use of acetonitrile, does not arise, but rather the carbon to nitrogen ratio in the $TiC_xN_yB_{1-x-y}$ system deposited on the substrate can in principle be adjusted between $0 \leq X \leq 1$. It is preferably $0.70 \leq X \leq 1.0$, more preferably $0.75 \leq X \leq 0.85$, at a reaction temperature of from 750° C. to 930° C. The exact composition of the hard material layer deposited on the substrate can be determined by means of the GDOES method for example.

A hard material layer of particularly high performance can be formed due to the fact that a TiCNB hard material layer in which the carbon to nitrogen proportion can be adjusted over a distinctly wider range than in the conventional MT-CVD processes can be deposited on the substrate and simultaneously the advantages of the MT-CVD process can be retained, namely that due to the lower temperature in the reactor sub-carbonization of the substrate is abated or avoided. The possible reduction of the reaction temperatures furthermore abates or essentially prevents the formation of a brittle eta phase at the interface between the substrate and the coating. The cutting properties of a thus-produced hard material layer on the substrate can also be improved in this way. In particular, the adhesion properties of the hard material layer on the substrate are also improved in this way since the adhesion between the hard material layer and the substrate takes place on an interface which is essentially free of an eta phase.

The carbon source in the process described hereinabove is preferably ethane ($C_2H_6$), ethene ($C_2H_4$) or ethyne ($C_2H_2$). These carbon sources are reactive enough to achieve deposition of the TiCNB hard material layer at relatively low temperatures. It is particularly preferable to use ethane ($C_2H_6$) as the carbon source. Ethane offers ease of handling in the MT-CVD process as well as high reactivity. Ethane is distinctly more reactive compared to the acetonitrile used in the conventional MT-CVD process. Accordingly, even small changes in ethane dosing lead to large changes in the reaction for depositing the TiCNB hard material layer on the substrate.

The carbon source is preferably liquid or gaseous at room temperature in order to simplify processing in the MT-CVD process. Here, room temperature is to be understood as meaning a temperature of 293K (20° C.).

It is preferable when the titanium source is $TiCl_4$, the boron source is $BCl_3$ and the nitrogen source is $N_2$. The gas system can preferably further comprise $H_2$ as balance gas and more preferably comprise at least one further balance gas such as argon for example.

The process is preferably carried out at a temperature of from 750° C. to 930° C., preferably of from 800° C. to 900° C., in order to reduce or completely prevent the formation of a brittle eta phase at the substrate interface. Nevertheless, on account of the relatively high reactivity of the carbon source used, reliable deposition of the TiCNB hard material layer on the substrate takes place, in particular at a preset carbon to nitrogen ratio.

The process is advantageously carried out at a pressure of from 50 mbar to 1000 mbar, preferably from 80 mbar to 500 mbar. These are pressures which are preferable in order to deposit the desired hard material layers in a CVD process.

It is preferable to apply a diffusion barrier, preferably titanium nitride (TiN), to the substrate prior to applying the TiCNB hard material layer. The thickness of the diffusion barrier is preferably 0.4 μm to 1 μm. In this way, diffusion of boron into the substrate can be reduced or prevented and, correspondingly, a brittle tungsten-cobalt-boron phase at the interface can be avoided or reduced. This can improve the adhesiveness of the TiCNB hard material layer on the substrate and can improve the cutting properties of a cutting tool produced in this way.

Furthermore, one or more outer layers and/or functional layers can preferably be applied to the TiCNB hard material layer, for example an aluminium oxide ($Al_2O_3$) layer, more preferably a corundum layer ($\alpha$-$Al_2O_3$) or a Zr(C,N) layer. In this way, the hardness of the surfaces can be even better tailored to the particular intended uses. Furthermore, atop the TiCNB layer, there may be functional and/or outer layers formed from layer(s) of nitrides, carbides, carbonitrides, carboxynitrides and/or boronitrides based on Ti and said layers can further comprise proportions of Al, Zr, Hf, Ta and/or Nb.

Depending on the field of application of the particular cutting tool, it is preferable to deposit different layer thicknesses of the TiCNB layer and the TiCNB layer is preferably deposited on the substrate in a range of from 1 μm to 15 μm, preferably in a range of from 2 μm to 12 μm. For cutting tools for milling applications it is preferable to deposit a TiCNB layer having a thickness in the range of from 3 μm to 4 μm and for cutting tools for turning workpieces it is preferable to deposit a TiCNB hard material layer of 10 μm in thickness.

In a further advantageous embodiment of the process, the substrate is a cemented carbide, a cermet, a hard material or a tool steel and prior to application of the particular coating the substrate is preferably pretreated, more preferably polished.

The TiCNB layer, i.e., the applied hard material layer, preferably in connection with the particular outer layer, is preferably aftertreated by wet blasting, dry blasting or staining for example, wherein, here, the surface structure and/or the surface roughness is preferably tailored to the particular intended field of application.

The hardness of the TiCNB layer can be increased further by adjusting the boron content in the gas system. The TiCNB hard material layer on the substrate then has a boron content of up to 5 at %, preferably up to 1 at %, but at least 0.01 at %, measured by the GDOES method. In terms of the empirical formula $TiC_xN_yB_{1-x-y}$ this gives: 0.01 at %$\leq$1-x-y$\leq$5 at %, preferably 0.01 at %$\leq$1-x-y$\leq$1 at %.

The object mentioned hereinabove is furthermore achieved by a hard material layer on a substrate, wherein the hard material layer is produced by the process described hereinabove.

The object mentioned hereinabove is furthermore also achieved by a cutting tool, preferably a cutting body or an indexable insert, comprising a substrate, wherein a hard material layer according to the process described hereinabove has been applied to the substrate.

The object is furthermore achieved by a cutting tool including a substrate of cemented carbide to which a TiCNB hard material layer has been applied, in which a ratio of carbon atoms (C) to nitrogen atoms (N) in the $TiC_xN_yB_{1-x-y}$ system deposited on the substrate is $0.70 \leq X \leq 1.0$, preferably $0.75 \leq X \leq 0.85$, and a polished section through the substrate and the hard material layer is substantially free of an eta phase following Murakami etching. Advantageous developments are evident from the claims which are dependent on this claim.

The cutting tool correspondingly comprises a substrate of cemented carbide to which a TiCNB hard material layer has been applied and the ratio of carbon atoms to nitrogen atoms in the $TiC_xN_yB_{1-x-y}$ system deposited on the substrate is $0.70 \leq X \leq 1.0$, preferably $0.75 \leq X \leq 0.85$. According to the invention, the polished section is essentially free of an eta phase following Murakami etching. The section is taken in a plane essentially perpendicular to the plane of the interface between substrate and coating. The section is subsequently polished and then subjected to Murakami etching, wherein the section is treated with the standard Murakami etchant consisting of 10 g of KoH, 10 g of $K_3Fe(CN)_6$ and 10 ml of $H_2O$ for a short contact time of 1-2 s at room temperature. The subsequent examination of the polished section thus prepared is effected using an optical microscope at 1000 fold magnification.

The eta phase is made visible in the polished section by the respective Murakami etching. As already discussed, the coating process described hereinabove makes it possible to deposit TiCNB having a $TiC_xN_yB_{1-x-y}$ system where $0.70 \leq X \leq 1.0$, preferably where $0.75 \leq X \leq 0.85$, even at relatively low temperatures. Correspondingly, there is essentially no formation of an eta phase at the substrate interface due to a temperature-driven sub-carbonization reaction, which makes it possible to achieve an improvement of the properties of the hard material coating.

It is preferable when there is no eta phase detectable in the polished section at a depth range in the substrate of from 0.4 μm to 1 μm from the interface between the substrate and the coating. It is particularly preferable when there is no eta phase whatsoever detectable in the correspondingly treated polished section.

The cutting tool advantageously comprises a TiCNB layer having a thickness of from 1 μm to 15 μm, preferably a thickness of from 2 μm to 12 μm and more preferably for milling applications a thickness of from 3 μm to 4 μm and more preferably for turning applications a thickness of 10 μm.

The cutting tool substrate is advantageously pretreated prior to application of the respective coating, preferably polished.

In order to achieve a particularly advantageous applicability of the cutting tool, the TiCNB hard material layer is preferably aftertreated and the surface structure and/or the surface roughness is tailored to the particular application, more preferably by wet blasting, dry blasting and/or staining.

BRIEF DESCRIPTION OF THE SEVERAL VIEWS OF THE DRAWING

Preferred further embodiments and aspects of the present invention are illustrated in detail by the description of the figures which follows.

DESCRIPTION OF THE INVENTION

Preferred working examples are described herein below with reference to the figures. Identical, similar or functionally identical elements are described with identical reference numerals and repeated description of these elements is dispensed with in some cases in order to avoid redundancies in the description.

Herein below, the process for producing TiCNB hard material layers on a substrate is illustrated once more, exemplarily, with reference to an example.

The TiCNB hard material layer is basically produced on the substrate by chemical vapor deposition, i.e. CVD, from a gas mixture comprising a titanium source, preferably $TiCl_4$, a boron source, preferably $BCl_3$, a nitrogen source, preferably $N_2$, and a carbon source. The carbon source is an alkane having at least two carbon atoms, i.e. from $C_2H_6$ (ethane) onward, an alkene, preferably ethene ($C_2H_4$), or an alkyne, preferably ethyne ($C_2H_2$).

In this way, it is possible to deposit a TiCNB layer having a freely adjustable atomic ratio of carbon atoms to nitrogen atoms in the $TiC_xN_yB_{1-x-y}$ system of $0 \leq X \leq 1$, preferably $0.10 \leq X \leq 0.90$, even at temperatures below 930° C. Due to the use of a particularly reactive organic precursor in the form of ethane, ethene or ethyne it is also possible to produce TiCNB hard material layers having a high carbon content in this way. The relatively high carbon content leads to a further increase in hardness of the TiCNB hard material layer and such a composition can be deposited on the substrate due to the use of alkanes, alkenes or alkynes as the organic precursor and the increased reactivity in the MT-CVD process associated therewith. However, as a result of the relatively low temperatures of the MT-CVD process, the formation of a brittle eta phase is simultaneously abated or completely avoided and the robustness of the cutting insert of the TiCNB hard material layer produced in this way is therefore improved compared to the layer produced in the conventional HT-CVD process. Accordingly, cutting bodies for cutting tools having improved properties can be produced in this way.

A specific working example is specified herein below:

Four different coatings were applied to substrates using a commercially available SuCoTec SCT600 TH CVD unit. The different coatings differ in the content of the boron source in the gas system used to deposit the TiCNB.

The substrate was a cemented carbide comprising 12 wt % of cobalt and 11 wt % of mixed carbides and said substrate was polished prior to coating. A TiN diffusion barrier of 0.4 μm in thickness was deposited on the substrate.

A $TiC_xN_yB_{1-x-y}$ layer was then deposited on the TiN diffusion barrier. The deposition was carried out by means of a gas system using $TiCl_4$, $C_2H_6$, $H_2$, $N_2$, $BCl_3$ at 920° C. and at a pressure of $1.6 \times 10^4$ Pa. The basic composition of the gas system for producing the $TiC_xN_yB_{1-x-y}$ layer was 23.3 vol % of $N_2$, 1.2 vol % of $TiCl_4$, 1.5 vol % of $C_2H_6$ and $H_2$ to balance. The total gas flow rate was 65.4 l/min. Ethane was accordingly used as the organic precursor.

Four different coatings were produced by adding to the stated gas system increasing proportions of $BCl_3$ of 0 ppm, 150 ppm, 380 ppm and 1070 ppm. A deposition time of 60 minutes for the TiN diffusion barrier and of 470 minutes for the TiCNB layer was kept constant for all coatings prepared.

The coated substrates thus produced were analysed as described herein below.

The coating thickness was determined by means of optical light microscopy on polished cross sections of substrates at three positions within the CVD reactor. The mass increase of 33 samples of the total number of samples was measured using a precision balance.

Determination of the surface topography and structure of a fracture cross section was carried out using a Zeiss ULTRA 55 plus Scanning Electron Microscope (SEM). The corresponding results are shown in FIG. 1.

Figure 1:
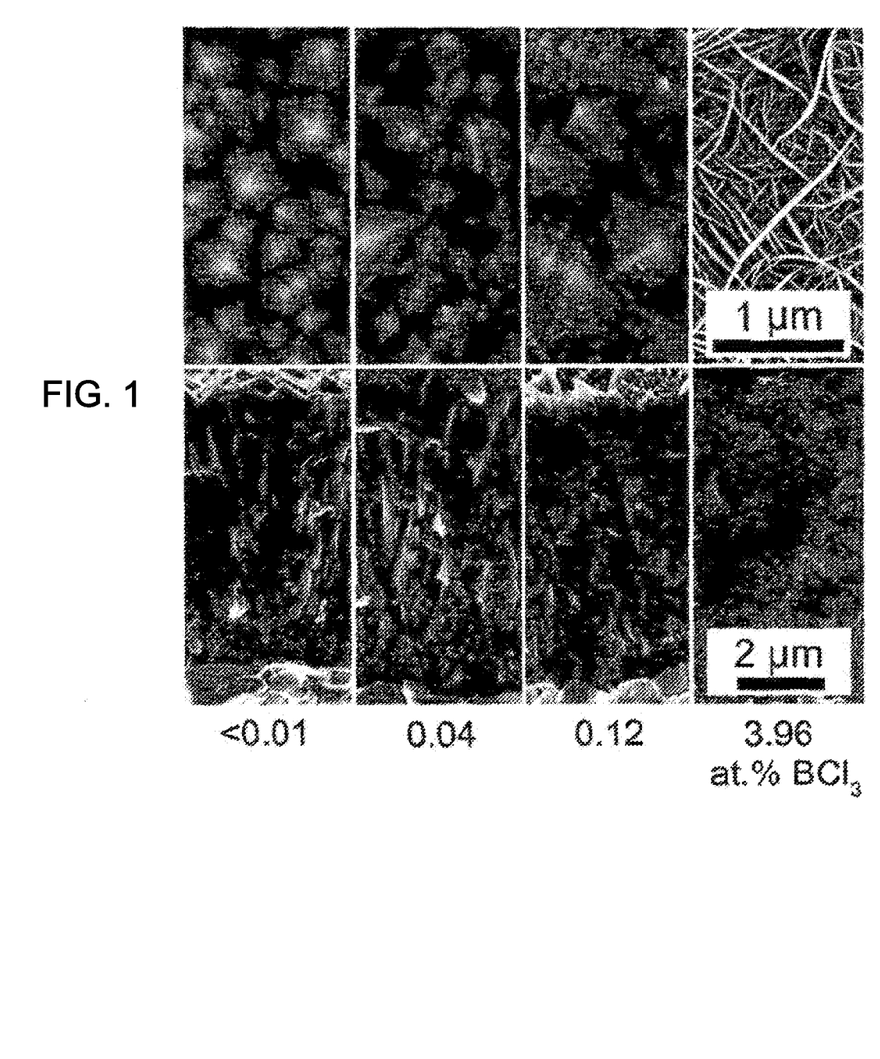
FIG. 1 shows the surface structures and kerf structures of the TiCNB hard material layer for various boron contents.

In FIG. 1, the boron contents increase from left to right in accordance with the $BCl_3$ proportions of 0, 150, 380 and 1070 ppm used in the gas system. These boron contents used in the gas system result in the boron contents of the TiCNB layer of <0.01, 0.04, 0.12 and 3.96 at % stated in the figure.

The corresponding chemical compositions of the TiCN-based coatings and, in particular, the determination of the boron content in the respective coatings was measured using a Jobin-Yvon Horiba JY 10000 Glow Discharge Optical Emission Spectroscope (GDOES).

FIG. 1 reveals different surface topographies and uniform grains implying a stable surface can be discerned at a boron content of the hard material layer of up to 0.12 at %. The surface topography shifts to a lamellar structure at a boron content of 3.96 at %. Correspondingly, a transition in terms of the crystal morphology is observed here from the equiaxial, uniform grain size to a lamellar structure in which the grains are completely broken up. Such a lamellar structure is only of limited suitability for coating cutting tools.

Correspondingly, in the process for producing a TiCNB hard material layer presented here, the boron content is preferably adjusted such that it comprises in the layer a proportion of up to 5 at %, preferably up to 1 at %, but at least 0.01 at %, measured with GDOES.

The substrates produced as mentioned hereinabove which are cutting bodies were subjected to both a turning test and a milling test. The turning test was a segment turning test which is a combination of end face and transverse turning procedure and was carried out on a low-alloy steel according to DIN 1.7225(42CRMO4) with a cutting speed $v_c$=220 m/min, a feed rate f=0.4 mm using a cooling liquid.

The milling tests were carried out with WC—Co substrates comprising 10 wt % of cobalt in a RPHX 1204 MO-ENM 31 geometry. The milling test was a single edge milling test with a cutting speed $v_c$=220 m/min and a feed rate per tooth of $f_z$=0.4 mm, a depth of cut $a_p$=2.5 mm and a contact breadth of $a_e$=40 mm on martensitic steel according to DIN 1.4021 (X20Cr13) in a dry milling procedure.

Figure 2:
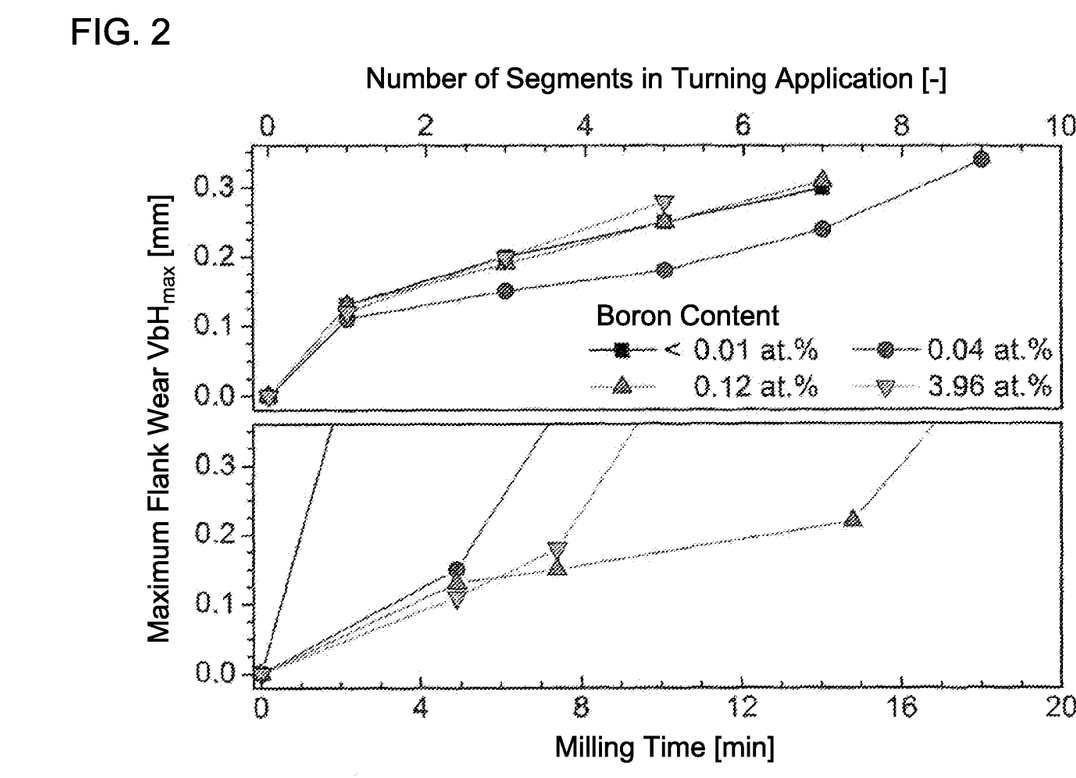
FIG. 2 shows diagrams relating to turning and milling tests carried out on the TiCNB hard material layers produced with various boron contents and FIG. 3 shows polished sections of TiCNB hard material layers produced with various boron contents on a substrate.

FIG. 2 shows the results obtained from the turning and milling tests, wherein the upper diagram shows the turning tests and the lower diagram shows the milling tests. Here, the flank wear on the main cutter (VbH) in millimeters in each case is plotted against service life (number of segments in turning test; milling time in milling test). It is assumed that the cutting insert is unusable at a flank wear of 0.3 mm. As is apparent from the diagrams, the tests show good results for the cutting inserts according to the invention.

An improvement in the wear properties was found in the continuous turning procedure at a low boron content of the TiCNB hard material layer of 0.04 at %. At a maximum proportion of 3.96 at %, an increasing tendency toward crater wear or flank wear was observed.

Also on milling, an improvement was found at a boron content of the TiCNB coating of 0.04 at % and of 0.12 at %. The performance declined distinctly for the highest boron proportion of 3.96 at %.

Figure 3:
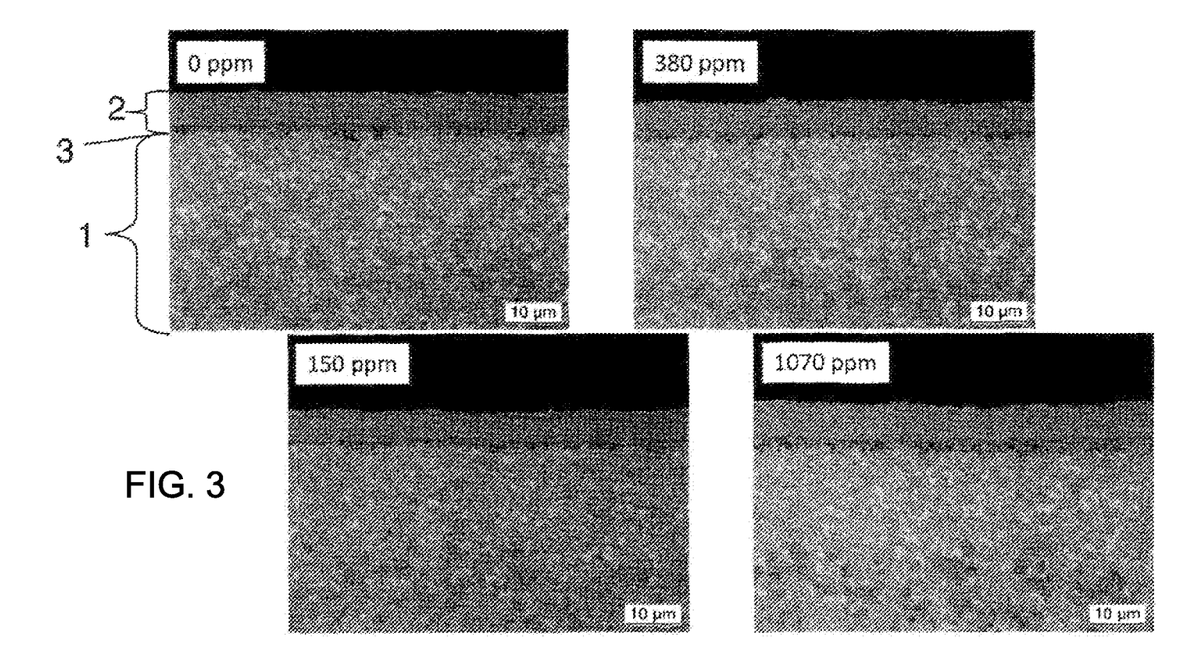

The polished sections shown in FIG. 3 were produced in a further experiment. To this end, the substrates produced at 0 ppm, 150 ppm, 380 ppm and 1070 ppm were each prepared in a polished section and etched according to the Murakami process. The eta phase at the interface 3 between the substrate 1 and the TiCNB layer 2 can be exposed by means of this selective etching procedure.

Carrying out Murakami etching is known in the field of metallurgy. The standard Murakami etchant is formed of 10 g of KOH, 10 g of $K_3Fe(CN)_6$ and 10 ml of $H_2O$. The polished sections etched with this etchant show, for example, distinct etchings in the region of the respective sigma phase. In the etching process carried out, the brittle eta phase is etched by the Murakami etchant and said eta phase is therefore clearly visible in the subsequent examination by optical microscopy.

The Murakami etchant is also the best known reagent for exposing the structure in WC—Co alloys. Murakami's reagent accentuates the carbide grains and darkens them slightly whereas the Co binder matrix remains untouched. It is known to use the Murakami etchant on WC—Co and other complex-sintered carbides and to immerse the respective sample for seconds to minutes in order to make the microstructure visible. The eta phase can be color-marked on use for 2 to 10 seconds. On longer etching times, the eta phase is attacked. The etchant is typically used at 20° C.

In order to make the eta phase visible in the polished section, the section was taken in a plane essentially perpendicular to the plane of the interface 3 between substrate 2 and coating 1. The section was polished and then subjected to Murakami etching, wherein the section was treated with the standard Murakami etchant consisting of 10 g of KOH, 10 g of $K_3Fe(CN)_6$ and 10 ml of $H_2O$ for a short contact time of 1-2 s at room temperature. The subsequent examination of the polished section thus prepared was effected using an optical microscope at 1000 fold magnification.

FIG. 3 shows the corresponding polished sections. As is evident from the polished sections, there is essentially no detectable eta phase at the interface 3 between the substrate 1 and the TiCNB hard material layer 2 at a boron proportion of 0 ppm. This implies that a sub-carbonization reaction due to the hard material coating process essentially does not take place and the brittle eta phase therefore does not form. Absence of the sub-carbonization reaction and absence of the eta phase is ascribed to the process being carried out as an MT-CVD process with the corresponding low temperatures. It is therefore assumed, for the other polished sections too, that any formation of an eta phase does not take place via a temperature induced sub-carbonization reaction at the interface 3.

There is likewise also essentially no eta phase discernible from the cross sections in FIG. 3 for the 150 ppm and the 380 ppm.

However, the probability of a brittle tungsten-cobalt-boron phase forming at the interface 3 increases with increasing boron content. However, the tungsten-cobalt-boron phase thus formed is not attributable to a sub-carbonization reaction due to the elevated temperatures inside the CVD reactor since the actual reaction temperatures in the proposed process are low.

In particular, the proposed process can also be carried out as an MT-CVD process at temperatures of from 750° C. to 930° C., wherein on account of the organic precursors employed, in the form of alkanes having at least two carbon atoms, alkenes or alkynes, the particular carbon contents in the TiCNB layer can then still be freely adjusted.

Due to the use of alkanes, alkenes or alkynes it is possible, in this way, to achieve application of a hard TiCNB layer to the substrate 1 on the one hand and on the other hand the formation of a brittle eta phase in the region of the interface 3 can be essentially avoided. This results in improved properties of the cutting tool produced in this way.

Accordingly, a cutting tool for a cutting apparatus is produced, said cutting tool comprising a suitable substrate, preferably a cemented carbide substrate, in the stated geometry. The cutting tool can be provided in the form of a cutting body for turning and milling apparatuses or in the form of an indexable insert for example.

A TiCNB hard material coating is then applied to this substrate with the process specified hereinabove, wherein the TiCNB hard material coating comprises a $TiC_xN_yB_{1-x-y}$ system having a carbon to nitrogen ratio of $0.70 \leq X \leq 1.0$, preferably $0.75 \leq X \leq 0.85$.

After preparation of a polished section and Murakami etching of the form described hereinabove, the polished section exhibits essentially no eta phase.

To prepare a cutting tool, preferably at least one outer layer and/or one functional layer is applied to the TiCNB hard material layer, preferably an aluminium oxide layer, more preferably a corundum layer and/or a zirconium layer, in order to further tailor the surface properties to the particular applications.

Furthermore, the TiCNB hard material layer can be subjected to an after treatment in order to achieve tailoring of the surface structure and/or the surface roughness to the particular application. This aftertreatment can be carried out by wet blasting, dry blasting and/or staining for example. Any outer layer and/or functional layer applied can also be subjected to such aftertreatment.

If applicable, all individual features illustrated in the individual working examples can be combined with one another and/or exchanged without departing from the scope of the invention.

The invention claimed is:

1. A process for producing a hard material layer on a substrate, the process comprising the following steps:
   depositing a TiCNB hard material layer by chemical vapor deposition (CVD) from a gas system including a titanium source, a boron source, at least one nitrogen source and at least one carbon source;
   providing the carbon source as an alkane having at least two carbon atoms, an alkene or an alkyne; and
   adjusting a boron content in the gas system to provide the TiCNB hard material layer on the substrate with a boron content, measured with the GDOES method, of up to 5 at % but at least 0.01 at %.

2. The process according to claim 1, wherein the carbon source is ethane, ethene or ethyne.

3. The process according to claim 1, wherein the titanium source is $TiCl_4$, the boron source is $BCl_3$ and the nitrogen source is $N_2$.

4. The process according to claim 3, wherein the gas system includes $H_2$ as a balance gas.

5. The process according to claim 4, wherein the gas system includes at least one further balance gas.

6. The process according to claim 5, wherein the at least one further balance gas is argon.

7. The process according to claim 1, which further comprises carrying out the chemical vapor deposition at temperatures of from 750° C. to 930° C.

8. The process according to claim 1, which further comprises applying a diffusion barrier to the substrate, prior to the step of depositing the TiCNB hard material layer.

9. The process according to claim 8, which further comprises forming the diffusion barrier of titanium nitride having a layer thickness of from 0.4 μm to 1 μm.

10. The process according to claim 1, which further comprises applying at least one of at least one outer layer or a functional layer to the TiCNB hard material layer.

11. The process according to claim 10, wherein the at least one outer layer or functional layer is at least one of an aluminum oxide layer, a corundum layer or a Zr(C,N) layer.

12. The process according to claim 1, which further comprises carrying out the chemical vapor deposition until a TiCNB layer is deposited on the substrate having:
   a thickness of from 1 μm to 15 μm.

13. The process according to claim 1, which further comprises adjusting a boron content in the gas system to provide the TiCNB hard material layer on the substrate with a boron content, measured with the GDOES method, of:
   up to 1 at % and
   at least 0.01 at %.

14. The process according to claim 1, which further comprises, at a reaction temperature of from 750° C. to 930° C., adjusting a carbon to nitrogen ratio in a $TiC_xN_yB_{1-x-y}$ system deposited on the substrate to:
   $0 \leq X \leq 1$,
   $0.70 \leq X \leq 1.0$ or
   $0.75 \leq X \leq 0.85$.

15. A hard material layer on a substrate, the hard material layer comprising:
   a TiCNB hard material layer deposited by chemical vapor deposition (CVD) from a gas system including a titanium source, a boron source, at least one nitrogen source and at least one carbon source;
   said carbon source including an alkane having at least two carbon atoms, an alkene or an alkyne; and
   due to an adjusted boron content in the gas system, said TiCNB hard material layer having a boron content, measured with the GDOES method, of at least 0.01 at % and up to 5 at %.

16. A cutting tool, comprising:
   a substrate of cemented carbide;
   a TiCNB hard material layer applied to said substrate and having a $TiC_xN_yB_{1-x-y}$ system;
   a ratio of carbon atoms (C) to nitrogen atoms (N) in said $TiC_xN_yB_{1-x-y}$ system deposited on said substrate of $0.70 \leq X \leq 1.0$;
   a polished section through said substrate and said hard material layer being substantially free of an eta phase following Murakami etching; and
   said TiCNB hard material layer having a boron content, measured with the GDOES method, of at least 0.01 at % and up to 5 at %.

17. The cutting tool according to claim 16, wherein said ratio is $0.75 \leq X \leq 0.85$.

18. The cutting tool according to claim 16, which further comprises a diffusion barrier disposed between said substrate and said TiCNB hard material layer.

19. The cutting tool according to claim 18, wherein said diffusion barrier is formed of titanium nitride and has a layer thickness of from 0.4 μm to 1 μm.

20. The cutting tool according to claim 16, which further comprises at least one of at least one outer layer or a functional layer applied to said TiCNB hard material layer.

21. The cutting tool according to claim 20, wherein said at least one outer layer or functional layer is at least one of an aluminum oxide layer, a corundum layer or a Zr(C,N) layer.

22. The cutting tool according to claim 16, wherein said TiCNB hard material layer has a boron content, measured with the GDOES method, of:
 up to 1 at %, and
 at least 0.01 at %.

23. The cutting tool according to claim 16, wherein said polished section has no eta phase detectable at a depth of from 0.4 μm to 1 μm from an interface between said TiCNB hard material layer and substrate.

* * * * *